United States Patent
Kim et al.

(10) Patent No.: US 8,952,876 B2
(45) Date of Patent: Feb. 10, 2015

(54) DISPLAY SUBSTRATE AND METHOD OF MANUFACTURING THE SAME

(75) Inventors: Hyung-Jun Kim, Yongin-si (KR); Sung-Haeng Cho, Chungchongbuk-do (KR); Yong-Mo Choi, Osan-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 884 days.

(21) Appl. No.: 12/900,846

(22) Filed: Oct. 8, 2010

(65) Prior Publication Data
US 2011/0181557 A1  Jul. 28, 2011

(30) Foreign Application Priority Data
Jan. 27, 2010  (KR) .............................. 2010-0007562

(51) Int. Cl.
G09G 3/36 (2006.01)
G11C 19/28 (2006.01)
G02F 1/1362 (2006.01)
G11C 19/18 (2006.01)

(52) U.S. Cl.
CPC .............. G11C 19/28 (2013.01); G02F 1/1362 (2013.01); G11C 19/184 (2013.01); G02F 2202/104 (2013.01)
USPC ................. 345/87; 345/204; 345/88; 345/76; 345/92; 345/98; 257/59; 257/72; 257/64; 257/70; 349/43

(58) Field of Classification Search
USPC .......... 345/87, 204, 88, 76, 92, 98, 211, 214, 345/600; 257/59, 72, 64, 70; 349/43
See application file for complete search history.

(56) References Cited

U.S. PATENT DOCUMENTS

| | | | | |
|---|---|---|---|---|
| 6,479,837 | B1 * | 11/2002 | Ogawa et al. | 257/59 |
| 2005/0142708 | A1 | 6/2005 | Son et al. | |
| 2006/0027162 | A1 * | 2/2006 | Kato et al. | 117/92 |
| 2006/0232533 | A1 * | 10/2006 | Miyazawa | 345/88 |
| 2007/0164289 | A1 * | 7/2007 | Jung | 257/72 |

FOREIGN PATENT DOCUMENTS

| | | |
|---|---|---|
| JP | 05-299653 | 12/1993 |
| JP | 07-135324 | 5/1995 |
| JP | 09-107108 | 4/1997 |
| JP | 2000-286427 | 10/2000 |
| JP | 2001-085703 | 3/2001 |
| JP | 2002-305209 | 10/2002 |

(Continued)

Primary Examiner — Shaheda Abdin
(74) Attorney, Agent, or Firm — F. Chau & Associates, LLC

(57) ABSTRACT

A display substrate includes a base substrate, a first insulating layer formed on a base substrate, a pixel including a pixel electrode having the first insulating layer, and a circuit including a circuit transistor disposed on a peripheral area to drive the pixel. The pixel includes a first channel formed on the base substrate having the first insulating layer formed thereon. The first channel includes a poly-silicon layer, a first source electrode and a first drain electrode formed on the first channel that are spaced apart from each other, and a first gate electrode formed on the first source electrode and the first drain electrode corresponding to the first channel which is formed of the transparent conductive material. The poly-silicon layer is formed at a front channel portion of the first channel proximal to the first gate electrode through the first gate electrode.

19 Claims, 13 Drawing Sheets

(56) References Cited

FOREIGN PATENT DOCUMENTS

| | | |
|---|---|---|
| JP | 233-273121 | 9/2003 |
| JP | 2006-114805 | 4/2006 |
| JP | 2006-178031 | 7/2006 |
| JP | 2007-129269 | 5/2007 |
| JP | 2007-324425 | 12/2007 |
| JP | 2009-147256 | 7/2009 |
| KR | 1020000014690 | 3/2000 |
| KR | 1020040023916 | 3/2004 |
| KR | 1020060028968 | 4/2006 |

* cited by examiner

DISPLAY SUBSTRATE AND METHOD OF MANUFACTURING THE SAME

CROSS-REFERENCE TO RELATED APPLICATION

This application claims under 35 U.S.C. §119 priority to and the benefit of Korean Patent Application No. 2010-7562, filed on Jan. 27, 2010 in the Korean Intellectual Property Office (KIPO), the entire content of which is incorporated by reference herein.

BACKGROUND OF THE INVENTION

1. Field of the Invention

The present disclosure relates to displays and, more particularly, to a display substrate, and a method of manufacturing the display substrate.

2. Description of the Related Art

A typical liquid crystal display (LCD) apparatus includes a display panel and a driving part that applies a driving signal to the display panel. A gate driving circuit has been directly formed on an array substrate to decrease the thickness of the LCD apparatus and to simplify the manufacturing process for the LCD apparatus. For example, when a thin-film transistor (TFT) is formed on a display area of the array substrate, the TFT for driving the gate driving circuit is formed in a peripheral area surrounding the display area at the same time. An amorphous silicon (a-Si) TFT has been generally used, but a poly-silicon (poly-Si) TFT, which performs its function with a high driving speed and a high display quality, has become more desirable.

Methods for forming a poly-Si thin-film in the poly-Si TFT can include directly forming the poly-Si thin-film on a substrate, or heat-treating an a-Si thin-film formed on the substrate by a laser beam to form the poly-Si thin-film.

In the method of heat-treating by laser beam, the a-Si thin-film is liquefied to a liquid state when the substrate on which the a-Si thin-film is formed is irradiated by laser beam. Then, the liquefied silicon re-solidifies with a nucleus as the center, and is rearranged as multiple grains having superior crystalline quality. Thus, the a-Si thin-film can be transformed into the poly-Si thin-film having high electrical conductivity.

However, when the laser beam irradiates a front surface of the substrate, the a-Si thin-film adjacent to the substrate is less crystallized, such that on-current may decrease. To solve the problem, the power of the laser beam may be increased, or the thickness of the a-Si thin-film may be decreased. However, in those situations, a gate line may be damaged, or an etching process margin may be increased.

SUMMARY OF THE INVENTION

Exemplary embodiments of the present invention provide a display substrate capable of improving driving characteristics.

Exemplary embodiments of the present invention also provide a method of manufacturing the display substrate.

According to an exemplary embodiment of the present invention a display substrate includes a base substrate including a display area and a peripheral area surrounding the display area. A first insulating layer is formed on the base substrate. A pixel is disposed in the display area, and including a pixel electrode having a transparent conductive material and formed on the base substrate on which the first insulating layer is formed. A circuit including a circuit transistor is disposed in the peripheral area to drive the pixel and including a first channel and first source, drain and gate electrodes, the first channel being formed on the base substrate on which the first insulating layer is formed and having a poly-silicon layer, the first source and drain electrodes being formed on the first channel and being spaced apart from each other, the first gate electrode being formed over the first source and drain electrodes corresponding to the first channel and having the transparent conductive material.

The transparent conductive material may include indium tin oxide (ITO) or indium zinc oxide (IZO).

The pixel may further include a pixel transistor connected to gate and data lines, and the pixel transistor may be electrically connected to the pixel electrode.

The pixel transistor may include a second gate electrode connected to the gate line and formed between the base substrate and the first insulating layer, a second channel disposed on the first insulating layer and including an amorphous silicon layer, and second source and drain electrodes formed on the second channel and spaced apart from each other.

The circuit transistor may further include a third gate electrode formed between the base substrate and the first insulating layer and corresponding to the first gate electrode.

The third gate electrode may be a metal.

The circuit may be a gate driving circuit that applies a gate signal to the gate line.

The poly-silicon layer formed over a portion of the first channel may be proximal to the first gate electrode.

The poly-silicon layer may be formed over the entire first channel.

The base substrate may be a transparent material.

The poly-silicon layer may be formed of a crystal grown from both ends of the first channel toward a central portion of the first channel.

According to an exemplary embodiment of the present invention, a method of manufacturing a display substrate includes forming a semiconductor layer comprising a first insulating layer and an amorphous silicon layer on a base substrate having a display area and a peripheral area surrounding the display area. A circuit metal pattern is formed in the peripheral area and a pixel metal pattern is formed in the pixel area using a photo pattern. The circuit metal pattern is patterned to form a first channel, and first source and drain electrodes. A first gate electrode is formed over the first source and drain electrodes, and a pixel electrode is formed over the pixel metal pattern, respectively, the first gate electrode and the pixel electrode including a transparent conductive material. The first channel is exposed to form a poly-silicon layer.

The poly-silicon layer may be formed by a front exposing process, such that light is irradiated toward an surface of the base substrate proximal to the first gate electrode in the front exposing process.

The poly-silicon layer may be formed in a portion of the first channel proximal to the first gate electrode.

The poly-silicon layer may be formed via the front exposing process and a back exposing process at the same time, such that the light irradiated toward the front surface of the base substrate is reflected by a reflective plate disposed under the base substrate and is irradiated toward a surface of the base substrate distal from the first gate electrode in the back exposing process.

The poly-silicon layer may be entirely formed over the first channel by the front exposing process and the back exposing process.

A crystal may grow from both ends of the first channel to a central portion to form the poly-silicon layer.

The patterning the circuit metal pattern may further include patterning the pixel metal pattern to form a second channel and second source and drain electrodes.

A third gate electrode may be formed on the base substrate corresponding to the first gate electrode before forming the first insulating layer and the semiconductor layer.

According to an exemplary embodiment of the present invention a display substrate includes a base substrate having a display area and a peripheral area. A gate driving circuit in the peripheral area includes top-gate thin-film transistors having transparent gate electrodes formed over channels. Pixels in the display area include bottom-gate pixel thin-film transistors. A poly-silicon layer is formed at front channel portions of the channels proximal to respective transparent gate electrodes by light passing through the transparent gate electrodes and irradiating amorphous silicon semiconductor layers of the channels.

DETAILED DESCRIPTION OF THE EMBODIMENTS

Figure 1:
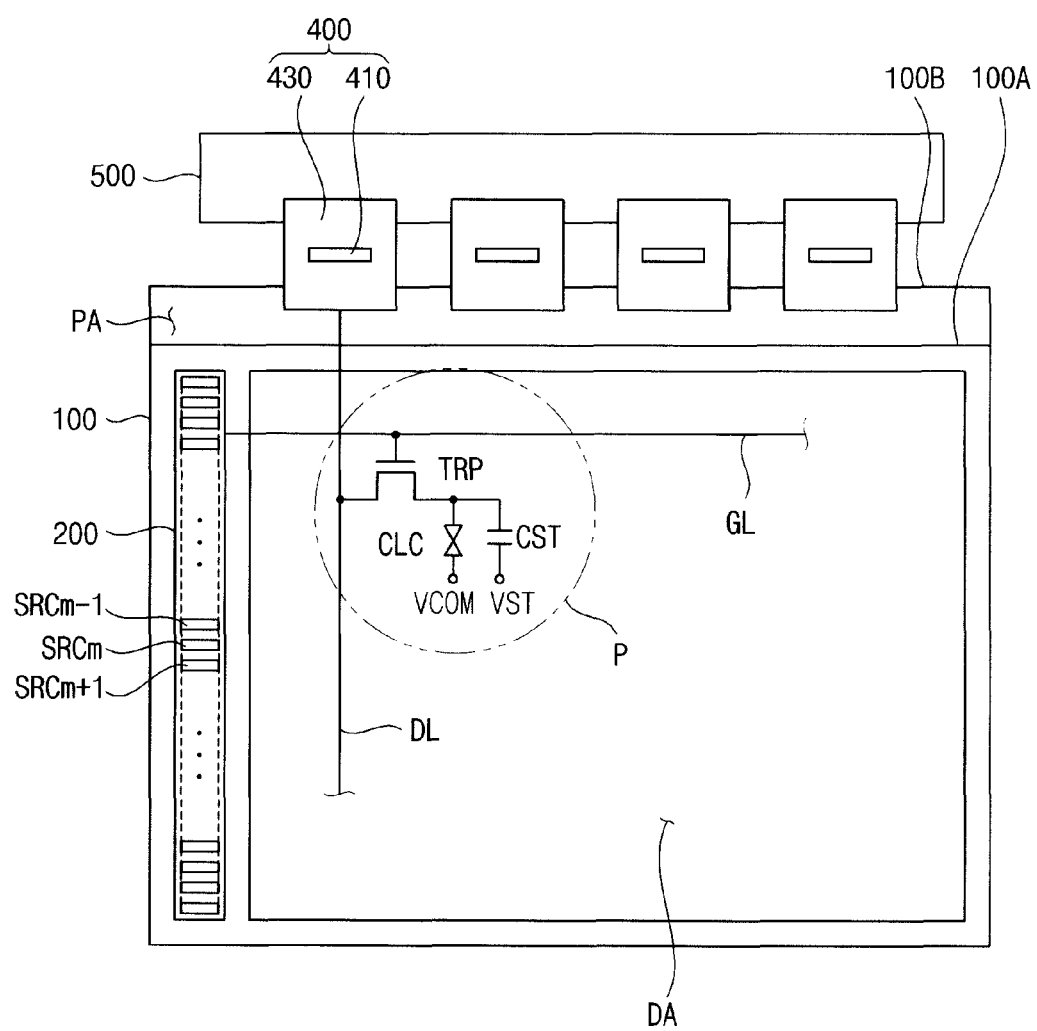
FIG. 1 is a plan view illustrating a display apparatus according to an exemplary embodiment of the present invention.

Exemplary embodiments of the present invention will now be described in more detail with reference to the accompanying drawings. In the drawings, the sizes and relative sizes of layers and regions may be exaggerated for clarity. The present invention may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

The exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, may occur. Thus, exemplary embodiments of the present invention should not be construed as limited to the particular shapes of regions illustrated herein but are to include deviations in shapes that may result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may not illustrate the actual shape of a region of an apparatus and are not intended to limit the scope of the present invention.

FIG. 1 is a plan view illustrating a display apparatus according to an exemplary embodiment of the present invention. A display apparatus includes a display panel 100, a gate driving circuit 200, a source driving circuit 400, and a printed circuit board (PCB) 500.

The display panel 100 includes a display substrate 100A and an opposing substrate 100B.

The display substrate 100A includes a display area DA and a peripheral area PA surrounding the display area DA. The display area DA includes a plurality of gate lines, a plurality of data lines DL crossing the gate lines GL, and a plurality of pixels P. Each of the pixels P includes a pixel transistor TRP connected to a gate line GL and a data line DL, a liquid crystal capacitor CLC electrically connected to the pixel transistor TRP, and a storage capacitor CST connected to the liquid crystal capacitor CLC in parallel. A common voltage VCOM is applied to the liquid crystal capacitor CLC, and a storage voltage VST is applied to the storage capacitor CST. The pixel transistor TRP has a bottom gate structure, and includes an amorphous silicon layer.

The gate driving circuit 200 includes a shift register sequentially providing to the gate lines gate signals having a high level. The shift register includes a plurality of stages SRCm−1, SRCm, SRCm+1, 'm' being a natural number. For example, an (m−1)-th stage SRCm−1 is connected to an (m−1)-th gate line Gm−1. An m-th stage SRCm is connected to an m-th gate line Gm. An (m+1)-th stage SRCm+1 is connected to an (m+1)-gate line Gm+1. The gate driving circuit 200 may be integrated in the peripheral area PA of the display substrate 100A corresponding to an end of the gate line GL. The gate driving circuit 200 includes a circuit transistor having a poly-silicon layer.

The source driving circuit 400 includes a source driving chip 410 that outputs data voltages to the data lines DL, and a flexible PCB 430 electrically that connects the PCB 500 to the display panel 100. The source driving chip 410 is mounted on the flexible PCB 430. Alternatively, the source driving chip 410 may be directly mounted on the display panel 100. In addition, the source driving chip 410 may be directly integrated in the peripheral area of the display panel 100.

Figure 2:
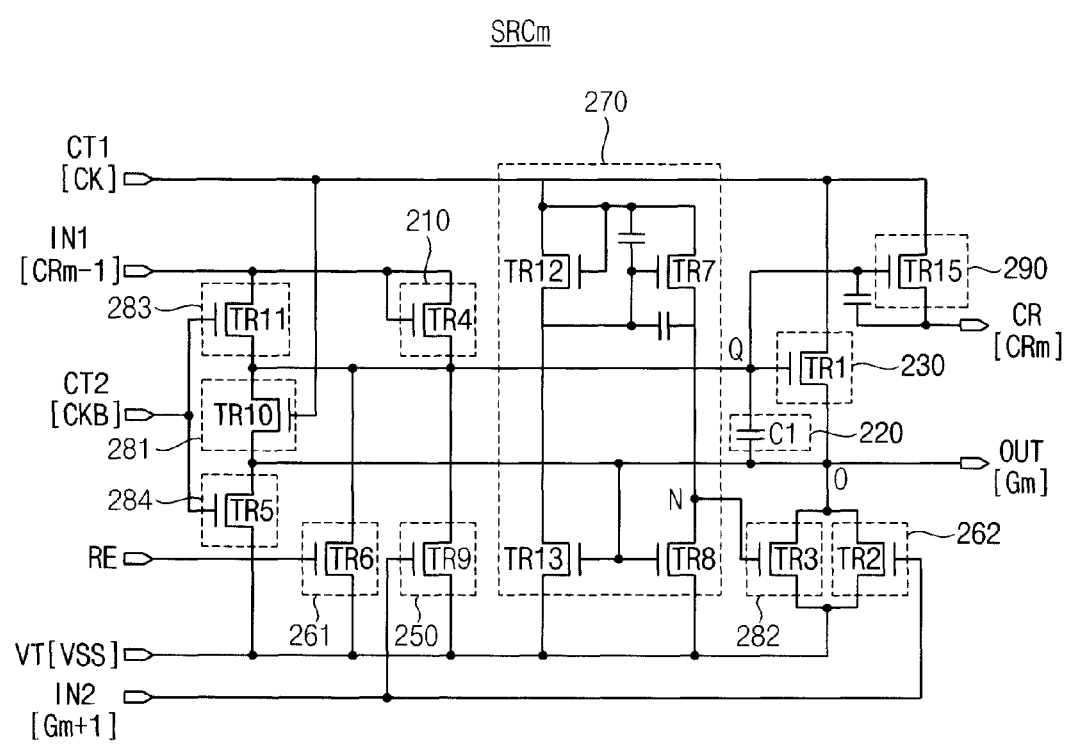
FIG. 2 is a schematic circuit diagram of a stage unit of FIG. 1.

FIG. 2 is a schematic circuit diagram of a stage unit of FIG. 1.

Referring to FIGS. 1 and 2, the m-th stage SRCm includes a buffer section 210, a charging section 220, a pull-up section 230, a discharging section 250, a first pull-down section 261, a second pull-down section 262, a switching section 270, a first maintaining section 281, a second maintaining section 282, a third maintaining section 283, a fourth maintaining section 284, and a carry section 290.

The buffer section 210 includes a fourth transistor TR4 having a control section and an input section connected to a first input terminal IN1 and an output section connected to a node Q. The node Q is connected to a first terminal of the charging section 220. When the buffer section 210 receives a high voltage of a (m−1)-th carry signal CRm−1 that is a signal of a previous stage, the charging section 220 charges a first voltage V1 corresponding to the high voltage.

The pull-up section 230 includes a first transistor TR1 having a control section connected to the node Q, an input section connected to a first clock terminal CT1 and an output section connected to an output node O. The control section of the pull-up section 230 is connected to a first terminal of the charging section 220. The output node O is connected to the first output terminal OT1. The first terminal of the charging section 220 is connected to the node Q, and a second terminal of the charging section 220 is a capacitor C1 connected to the output node O. During an m-th period of a frame in which a boosting voltage VBT is applied to the control section of the pull-up section 230, the pull-up section 230 outputs a high voltage of the clock signal CK as a high voltage of an m-th gate signal Gm.

The discharging section 250 includes a ninth transistor TR9 having a control section connected to a second input terminal IN2, an input section connected to the node Q and an output section connected to the voltage terminal VT. When the second input terminal IN2 receives a high voltage of a (m+1)-th gate signal Gm+1, the discharging section 250 discharges a voltage of the node Q as a low voltage VSS applied to the voltage terminal VT.

The first pull-down section 261 includes a sixth transistor TR6 having a control section connected to a reset terminal RE, an input section connected to the node Q and an output section connected to the voltage terminal VT. When the reset terminal RE receives a high voltage, the first pull-down section 261 pulls down a voltage of the node Q to the low voltage VSS applied to the voltage terminal VT.

The second pull-down section 262 includes a second transistor TR2 having a control section connected to the second input terminal IN2, an input section connected to the output node O and an output section connected to the voltage terminal VT. When the second input terminal IN2 receives a high voltage of the (m+1)-th gate signal Gm+1, the second pull-down section 262 pulls down a voltage of the output node O to the low voltage VSS.

The switching section 270 includes a twelfth transistor TR12, a seventh transistor TR7, a thirteenth transistor TR13, and an eighth transistor TR8. The switching section 270 discharges a voltage of a node Q to the low voltage VSS during (m−1)-th and m-th periods of a frame in which the high voltage is applied to the node Q.

The node Q of the switching section 270 receives a node signal having a phase substantially the same as the clock signal CK applied to the first clock terminal T1 during a remaining period of a frame in which the low voltage is applied to the node Q. The second maintaining section 282 operates in response to the node signal.

The first maintaining section 281 includes a tenth transistor TR10 having a control section connected to the first clock terminal CT1, an input section connected to the node Q and an output section connected to the output node O. When the first clock terminal CT1 receives a high voltage of the clock signal CK, the first maintaining section 281 maintains a voltage of the node Q at the low voltage VSS.

The second maintaining section 282 includes a third transistor TR3 having a control section connected to the node N, an input section connected to the output node O and an output section connected to the voltage terminal VT. When the node N receives a high voltage, the second maintaining section 282 maintains a voltage of the output node O at the low voltage VSS.

The third maintaining section 283 includes an eleventh transistor TR11 having a control section connected to the second clock terminal CK2, an input section connected to the node Q and an output section connected to the first input terminal IN1. When the second clock terminal CK2 receives a high voltage, the third maintaining section 283 maintains the node Q at the low voltage VSS of a reverse clock signal CKB reversed to the clock signal.

The fourth maintaining section 284 includes a fifth transistor TR5 having a control section connected to the second clock terminal CK2, an input section connected to the output node O and an output section connected to the voltage terminal VT. When the second clock terminal CK2 receives a high voltage, the fourth maintaining section 284 maintains the output node O at the low voltage VSS. The first to fourth maintaining sections 281, 282, 283, 284 maintain the output node O at the low voltage VSS during periods except an m-th period of a frame. In this case, the output node O is the m-th gate signal Gm outputted to the output terminal OUT.

The carry section 290 includes a fifteenth transistor TR15 having a control section connected to the node Q, an input section connected to the first clock terminal CK1 and an output section connected to the carry terminal CR. When the node Q receives a high voltage, the carry section 290 outputs an m-th carry signal CRm having a high voltage to the carry terminal CR.

Figure 3A:
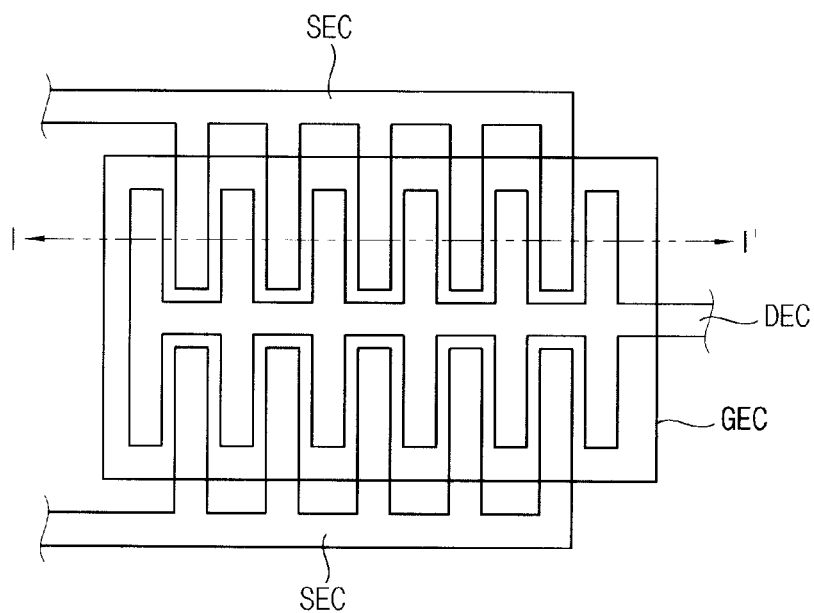
FIG. 3A is a plan view illustrating a pixel transistor of FIG. 1.
Figure 3B:
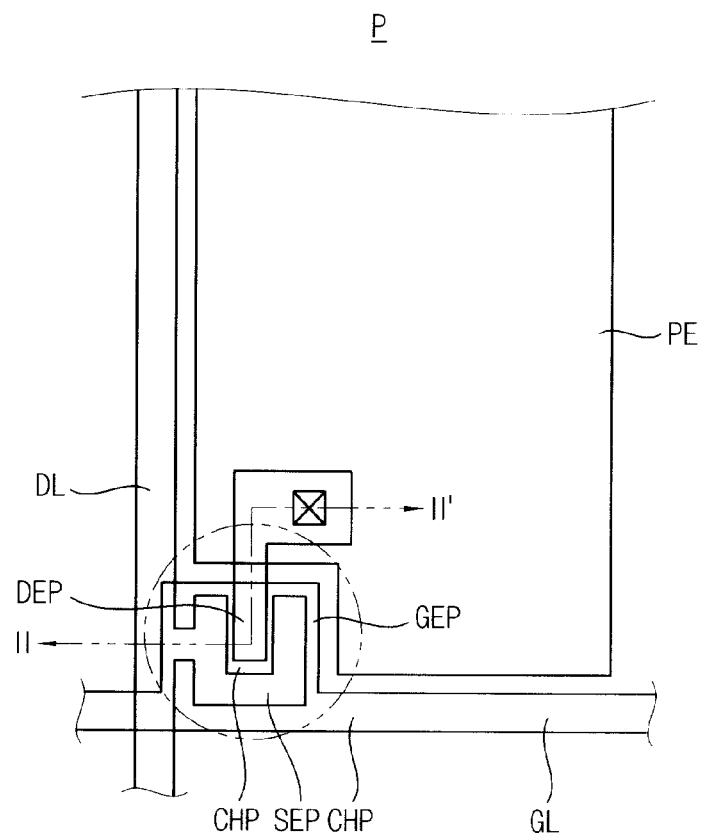
FIG. 3B is a plan view illustrating a circuit transistor of FIG. 2.
Figure 4:
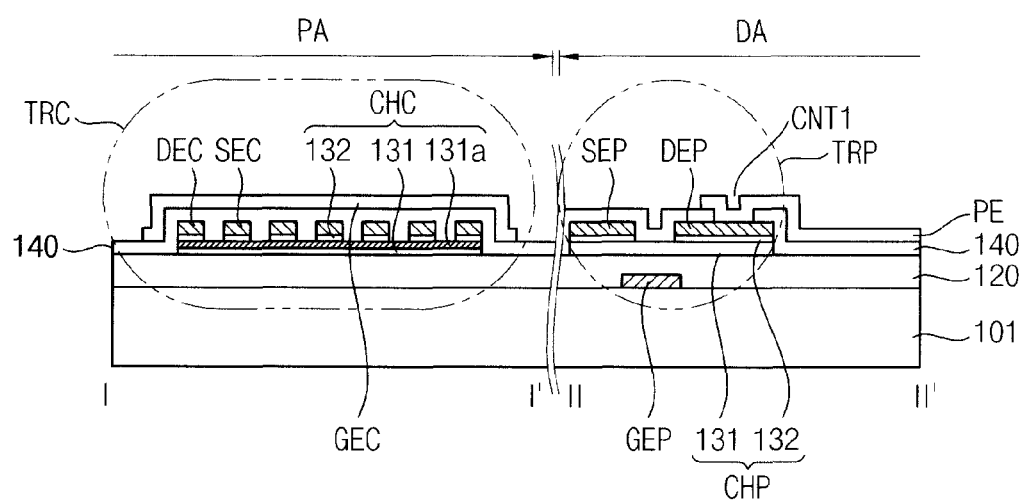
FIG. 4 is a cross-sectional view illustrating a display substrate of FIG. 1.

FIG. 3A is a plan view illustrating a pixel transistor of FIG. 1. FIG. 3B is a plan view illustrating a circuit transistor of FIG. 2. FIG. 4 is a cross-sectional view illustrating a display substrate of FIG. 1 taken across section I-I' of FIG. 3A and section II-IF of FIG. 3B.

Referring to FIGS. 1, 3A and 4, the display substrate 100A includes a base substrate 101 having the display area DA and the peripheral area PA. The peripheral area PA of the base substrate 101 includes the gate driving circuit 200. The gate driving circuit 200 includes the m-th stage SRCm having a plurality of transistors TR1, TR2, ..., TR15. Hereinafter, a transistor of the gate driving circuit 200 is referred to generally as a circuit transistor TRC.

The circuit transistor TRC includes a first source electrode SEC, a first drain electrode DEC, a first channel CHC and a first gate electrode GEC. The circuit transistor TRC has a top-gate structure.

A first insulating layer 120 is disposed on the base substrate 101. The first source electrode SEC and the first drain electrode DEC are disposed on the first insulating layer 120, and are spaced apart from each other.

The first source electrode SEC may have a convex and concave structure which has a repeated U-shape. When the first source electrode SEC has the U-shape, a ratio of a channel length to a channel width (W/L) may be increased, so that a mobility of an electric charge drifting through the channel is increased to improve the electric characteristics of a transistor. The first drain electrode DEC may also have the convex and concave structure which has a repeated U-shape corresponding to the first source electrode SEC.

The first channel CHC is defined by a separated area between the first source electrode SEC and the first drain electrode DEC. The first channel CHC includes a poly-silicon layer. The poly-silicon layer of the first channel CHC is formed at a front channel portion 131a proximal to the first gate electrode GEC.

A second insulating layer 140 is formed over the first source electrode SEC and the first drain electrode DEC.

The first gate electrode GEC is formed on the second insulating layer 140 in the peripheral area PA, and has a transparent conductive material substantially the same as a pixel electrode PE in the pixel area DA.

The first source electrode SEC and the first drain electrode DEC are insulated from the first gate electrode GEC by the second insulating layer 140.

Referring to FIGS. 1, 3B and 4, the display area DA of the base substrate 101 includes pixels. Each of the pixels includes the pixel transistor TRP connected to the gate line GL and the data line DL, and the pixel electrode PE electrically connected to the pixel transistor TRP.

The pixel transistor TRP includes a second gate electrode GEP, a second source electrode SEP, a second drain electrode DEP and a second channel CHP. The pixel transistor TRP has a bottom-gate structure. For example, the pixel transistor TRP may be proximal to an area in which the data line DL and the gate line GL cross each other.

The second gate electrode GEP is extended from the gate line GL. The first insulating layer 120 is disposed on the second gate electrode GEP.

The second source electrode SEP and the second drain electrode DEP are disposed on the first insulating layer 120 corresponding to the second gate electrode GEP. The second gate electrode GEP is insulated from the second source electrode SEP and the second drain electrode DEP by the first insulating layer 120.

The second source electrode SEP is extended from the data line DL. The second drain electrode DEP is spaced apart from the second source electrode SEP to define the second channel CHP. The second channel CHP is defined by a separated area between the second source electrode SEP and the second drain electrode DEP. The second channel CHP includes an amorphous silicon layer a-Si.

The second insulating layer 140 is disposed on the second source electrode SEP and the second drain electrode DEP. A first contact hole CNT1 is formed through the second insulating layer 140 to expose the second drain electrode DEP.

The pixel electrode PE is electrically connected to the second drain electrode DEP through the first contact hole CNT1. The pixel electrode PE has a transparent conductive material substantially the same as the first gate electrode GEC formed in the peripheral area.

FIGS. 5A, 5B, 5C, 5D, 5E and 5F are cross-sectional views illustrating a method for forming the display substrate of FIG. 4.

Figure 5A:
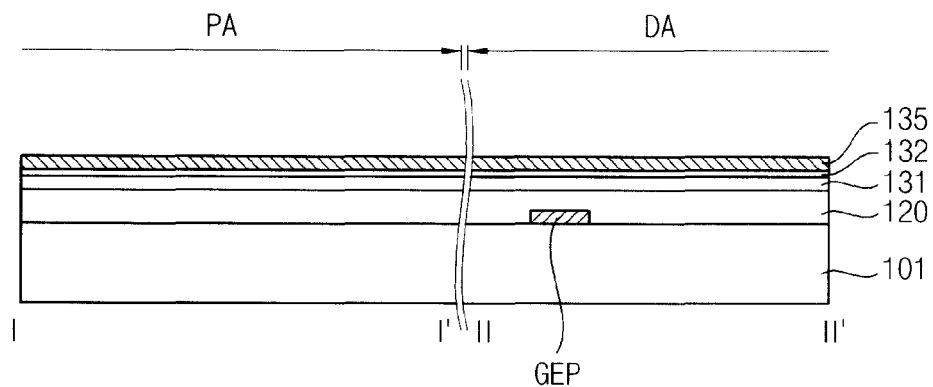
FIGS. 5A, 5B, 5C, 5D, 5E and 5F are cross-sectional views illustrating a method for forming the display substrate of FIG. 4.

Referring to FIGS. 4 and 5A, a first metal layer is formed on the base substrate 101. A first metal pattern is formed by a first photo pattern. The first metal pattern includes the gate line GL and the second gate electrode GEP formed in the display area DA.

The first insulating layer 120 is formed on the first base substrate 101 having the first metal pattern formed on the first base substrate 101. The first insulating layer 120 may include an inorganic insulating material.

A semiconductor layer 131 having amorphous silicon, an ohmic contact layer 132 having impurities, and a second metal layer 135 are formed on the first insulating layer 120.

Figure 5B:
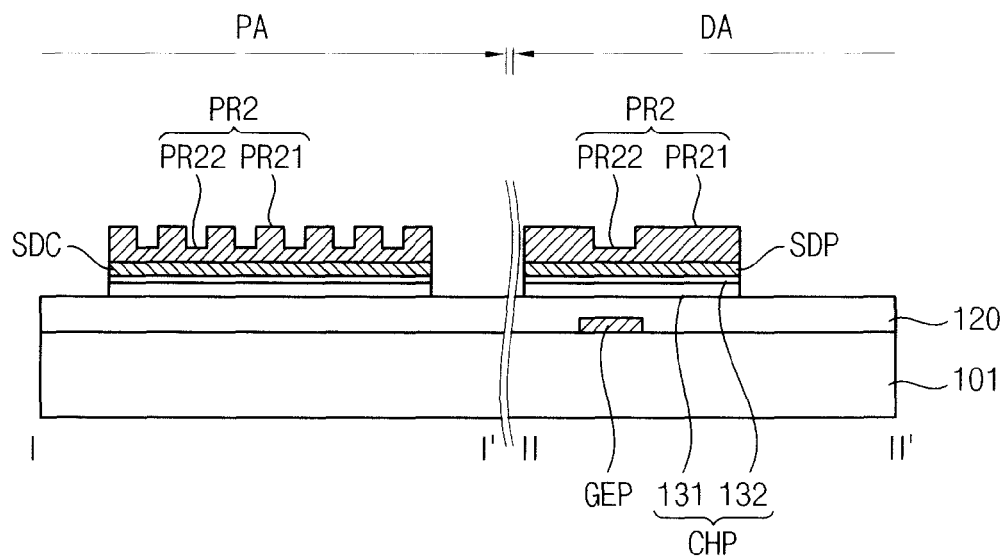

Referring to FIGS. 4 and 5B, a second photo pattern PR2 is formed on the first base substrate 101 on which the second metal layer 135 is formed. A pixel metal pattern SDP is formed in the display area DA and a circuit metal pattern SDC is formed in the peripheral area PA, using the second photo pattern PR2.

The second photo pattern PR2 includes a first pattern PR21 having a first thickness and a second pattern PR22 having a second thickness smaller than the first thickness. The first pattern PR21 is disposed in an area corresponding to the first source electrode SEC, the first drain electrode DEC, the second source electrode SEP, and the second drain electrode DEP. The second pattern PR22 is disposed in an area corresponding to the first channel CHC and the second channel CHP.

Figure 5C:
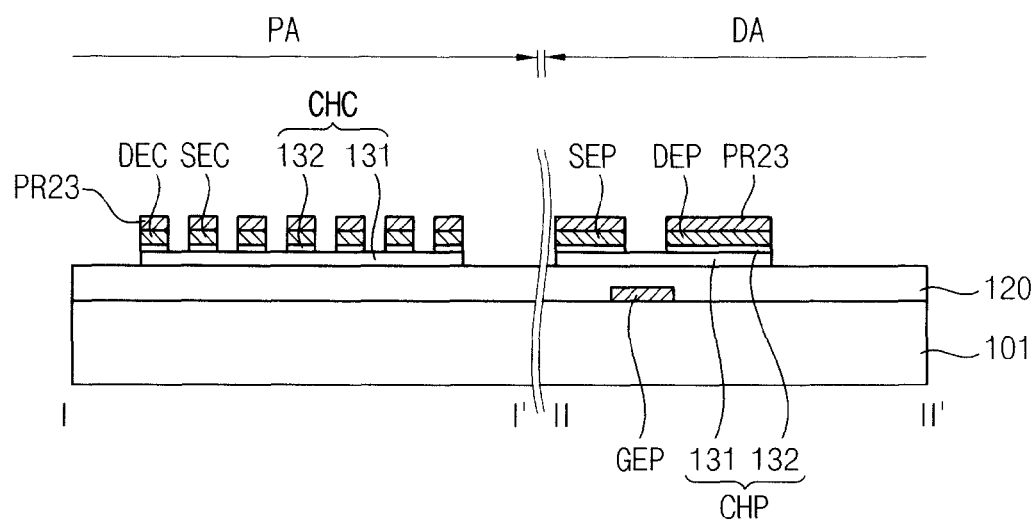

Referring to FIGS. 4 and 5C, the second photo pattern PR2 is partially removed to form a third pattern PR23 in an area corresponding to the first source and drain electrodes SEC, DEC, and the second source and drain electrodes SEP, DEP.

The circuit metal pattern SDC formed in the peripheral area PA is patterned by the third pattern PR23 to form the first source electrode SEC and the first drain electrode DEC. The pixel metal pattern SDP formed in the display area DA is patterned to form the second source electrode SEP and the second drain electrode DEP. The ohmic contact layer 132 exposed by the first source electrode SEC and the first drain electrode DEC is removed to expose the semiconductor layer 131 of the first channel CHC. In addition, the ohmic contact layer 132 exposed by the second source electrode SEP and the second drain electrode DEP is removed to form the semiconductor layer 131 of the second channel CHP. Then, the third pattern PR23 is removed.

Figure 5D:
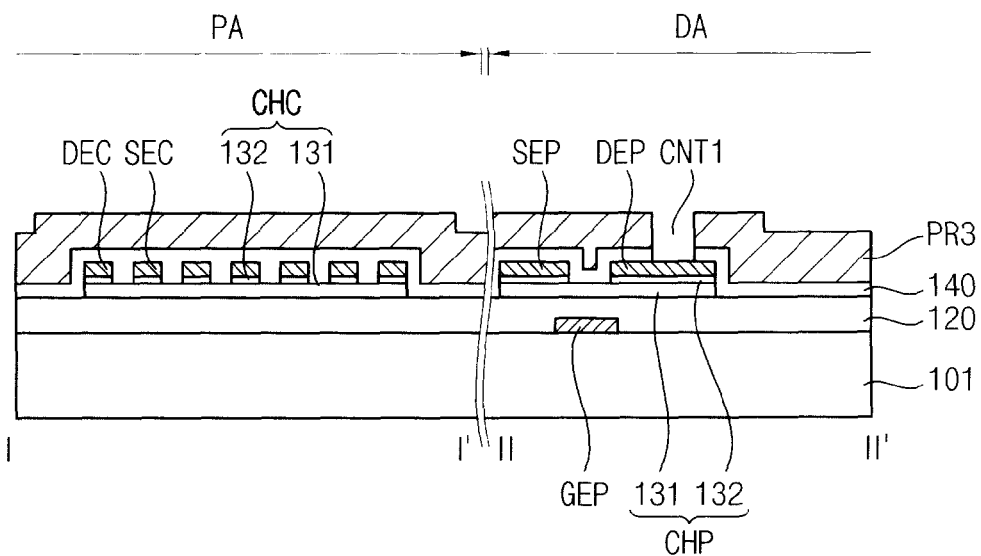

Referring to FIGS. 4 and 5D, the second insulating layer 140 is formed on the base substrate 101 having the first channel CHC and the second channel CHP formed on the base substrate 101. The first contact hole CNT1 is formed in the display area DA using the third photo pattern PR3. The contact hole CNT1 exposes the second drain electrode DEP. Then the third photo pattern PR3 is removed.

Figure 5E:
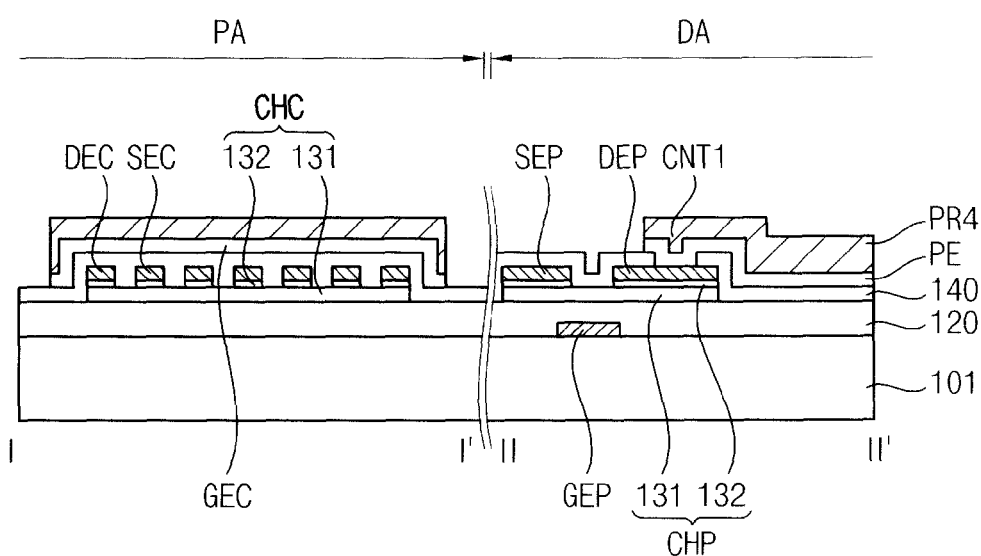

Referring to FIGS. 4 and 5E, a transparent conductive layer is formed on the base substrate 101 on which the first contact hole CNT1 is formed. The first gate electrode GEC and the pixel electrode PE are respectively formed in the peripheral area PA and the display area DA using a fourth photo pattern PR4. Then, the fourth photo pattern PR4 is removed.

Figure 5F:
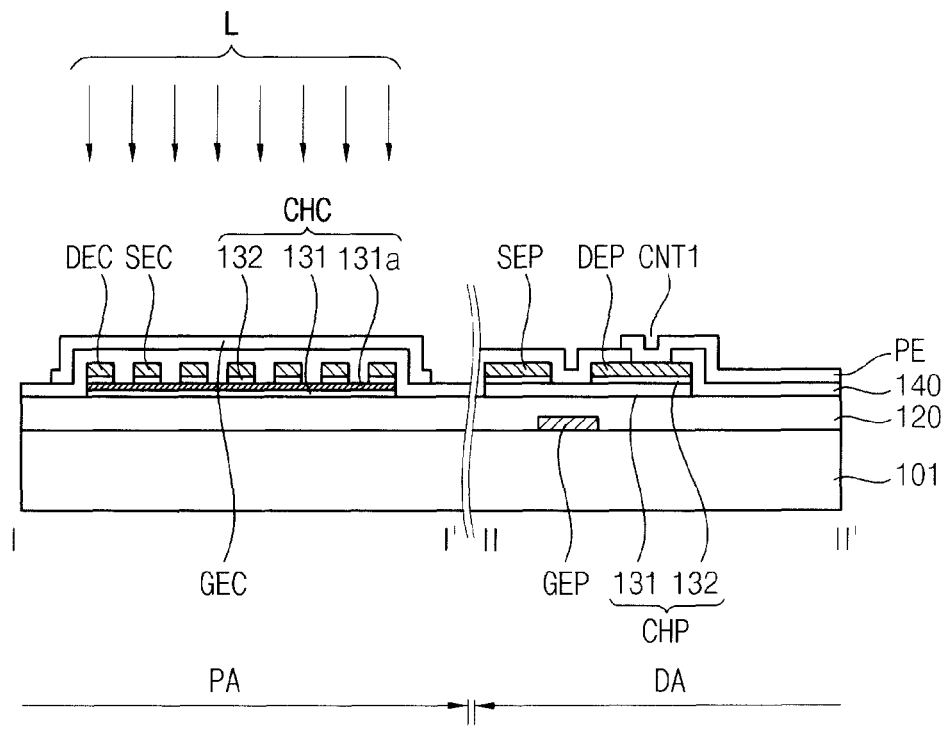

Referring to FIGS. 4 and 5F, light L is irradiated into the front surface of the base substrate 101 in the peripheral area PA, where the first channel CHC of the gate driving circuit 200 is formed. For example, the light L may be a laser beam.

The light L passes through the first gate electrode GEC having the transparent conductive material and is irradiated into the semiconductor layer 131 of the first channel CHC, so that amorphous silicon a-Si of the semiconductor layer 131 is partially crystallized. When the light L is irradiated into the front surface of the base substrate 101, the poly-silicon layer 131a is formed at a front channel portion proximal to the first gate electrode GEC of the first channel CHC.

The light L is irradiated after forming the first gate electrode GEC, but it is not limited thereto. Alternatively, the light L may be irradiated in forming the semiconductor layer 131 having amorphous silicon, forming the ohmic contact layer 132 doped with impurities, etching the second metal layer to form the first source electrode SEC and the first drain electrode DEC, and forming the second insulating layer 140.

As such, according to exemplary embodiments of the present invention, the gate electrode having the transparent conductive material is formed over the source and drain electrodes in a top-gate structure, and the light is irradiated into the front surface of the base substrate in a top exposing process. Therefore, the poly-silicon layer can be formed at the front channel portion of the channel through the gate electrode, such that characteristics of the poly-silicon transistor may be improved.

Generally, the bottom-gate structure is classified into a front channel portion proximal to a gate electrode, a bulk portion, and a back channel portion proximal to a source electrode and a drain electrode according to a depth from the front surface of the base substrate 101. In a poly-silicon transistor crystallized from an amorphous silicon transistor having the bottom-gate structure, the characteristics of the transistor are excellent when the poly-silicon layer is formed at the front channel portion.

However, if the light is irradiated into the first channel CHC via a top exposing process in which the light is irradiated into the front surface of the base substrate 101, the poly-silicon layer would be formed at the back channel portion of the second channel CHC, so that high leakage current and low ion characteristics would be caused. However, the light is not irradiated into the display area DA, and the second channel CHP of the pixel transistor TRP merely includes amorphous silicon.

Figure 6:
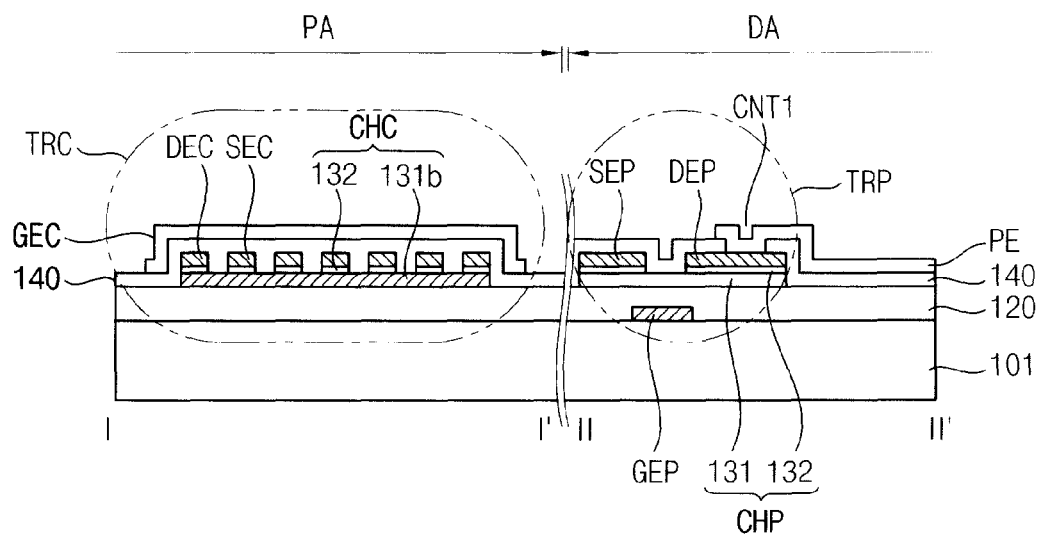
FIG. 6 is a cross-sectional view illustrating a display substrate according to an exemplary embodiment of the present invention.

FIG. 6 is a cross-sectional view illustrating a display substrate according to an exemplary embodiment of the present invention.

The display substrate according to the present exemplary embodiment is substantially the same as the display substrate according to the previous exemplary embodiment except that the poly-silicon layer of the first channel CHC is entirely formed over the first channel CHC. Accordingly, any further repetitive explanation will be omitted.

Referring to FIG. 6, the circuit transistor TRC according to the present exemplary embodiment includes the first source electrode SEC, the first drain electrode DEC, the first channel CHC, and the first gate electrode GEC. The circuit transistor TRC has a top-gate structure.

The gate insulating layer 120 is disposed on the base substrate 101. The first source electrode SEC and the first drain electrode DEC are formed on the gate insulating layer 120 and are spaced apart from each other.

The first channel CHC is defined by a separated area between the first source electrode SEC and the first drain electrode DEC. The first channel CHC includes a poly-silicon layer. The poly-silicon layer of the first channel CHC is entirely formed over first channel CHC.

The second insulating layer 140 is formed on the first source electrode SEC and the first drain electrode DEC.

The first gate electrode GEC is formed on the second insulating layer 140 in the peripheral area PA, and has a transparent conductive material substantially the same as a pixel electrode PE in the pixel area PA.

The first source electrode SEC and the first drain electrode DEC are insulated from the first gate electrode GEC by the second insulating layer 140.

Figure 7A:
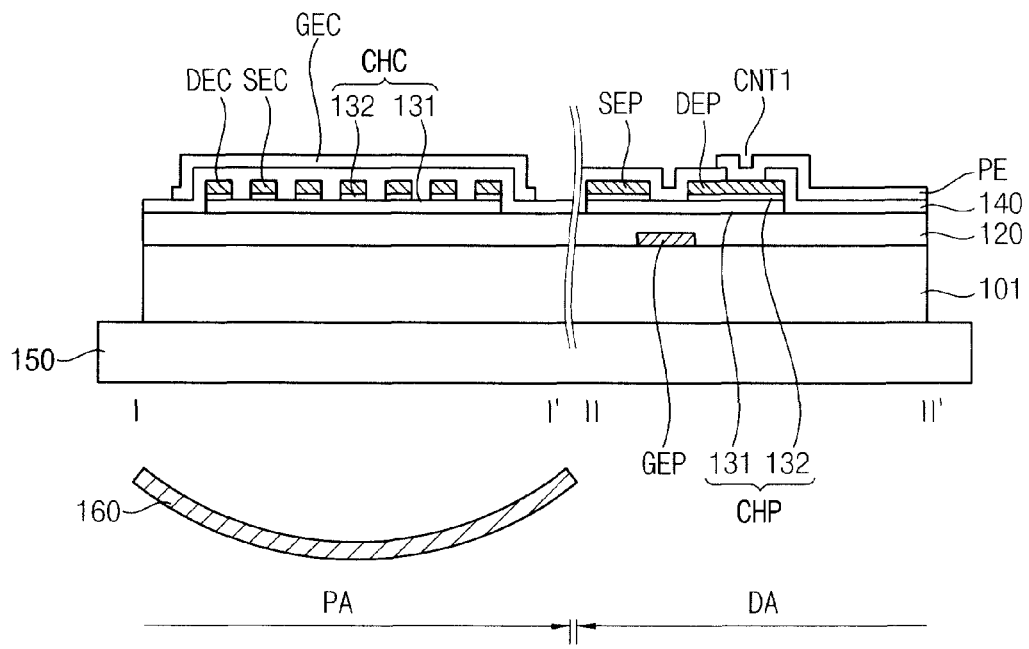
FIGS. 7A, 7B and 7C are cross-sectional views illustrating a method for forming the display substrate of FIG. 6.
Figure 7B:
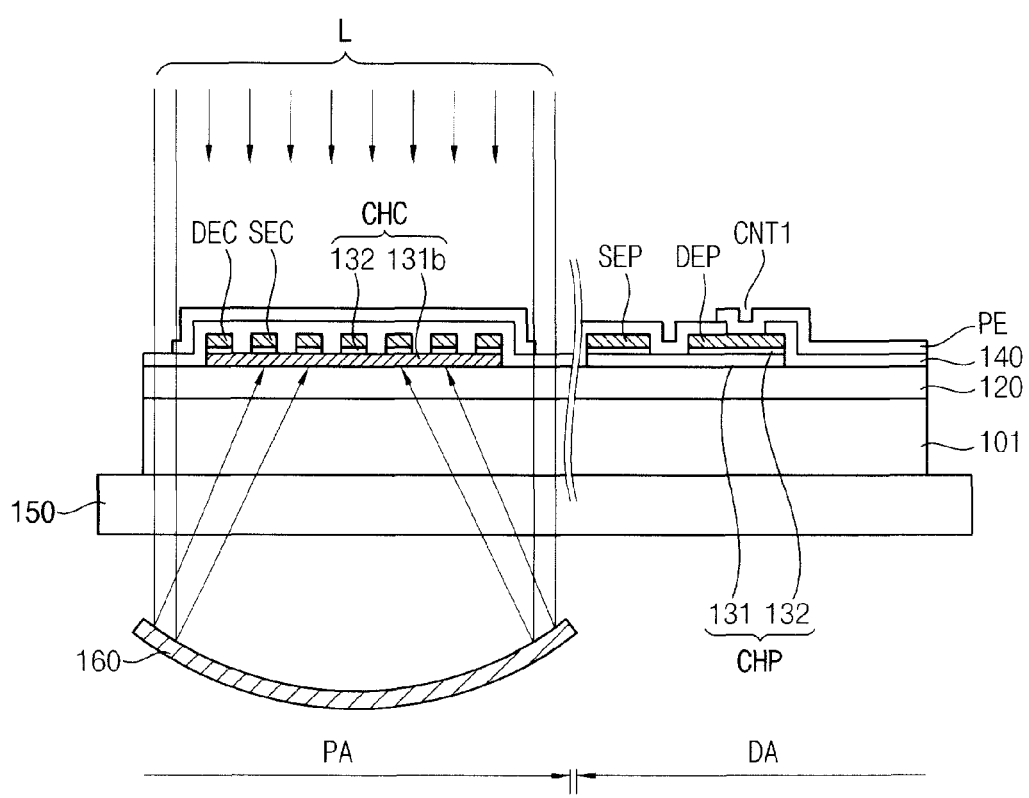
Figure 7C:
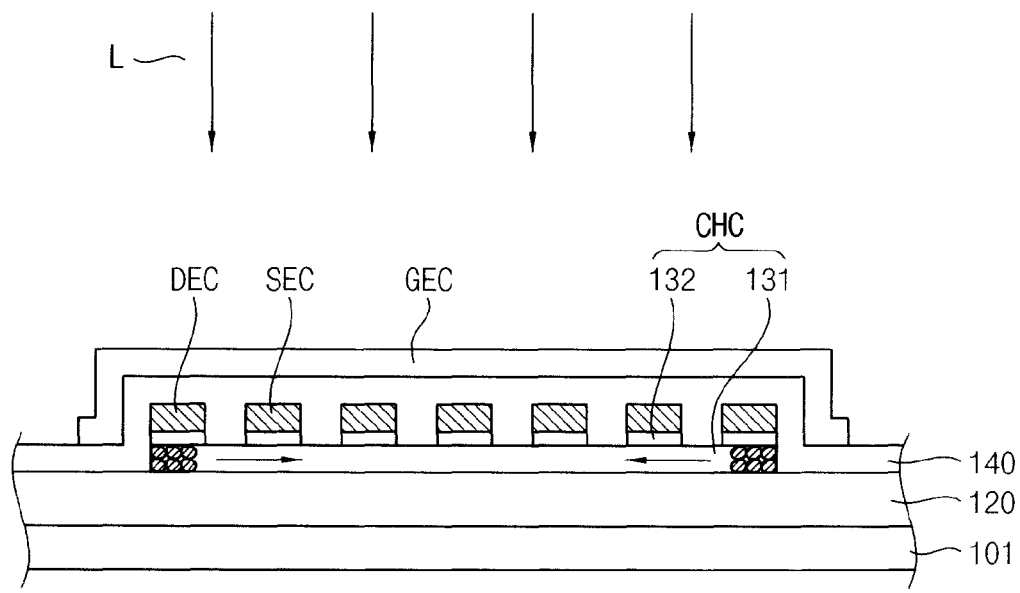

FIGS. 7A, 7B and 7C are cross-sectional views illustrating a method for forming the display substrate of FIG. 6.

The method for forming the display substrate according to the present exemplary embodiment is substantially the same as the method for forming the display substrate according to the previous exemplary embodiment except for further forming a reflective plate 160 under the base substrate 101 in crystallizing the first channel CHC. Accordingly, any further repetitive explanation will be omitted.

Referring to FIGS. 6 and 7A, a stage 150 having a transparent material is formed under the base substrate 101 having the circuit transistor TRC formed on the base substrate 101. The circuit transistor TRC includes the first source electrode SEC, the first drain electrode DEC, the first channel CHC, and the first gate electrode GEC. The reflective plate 160 having a curved surface is disposed under the stage 150 of the base substrate 101.

Referring to FIGS. 6 and 7B, the light L is irradiated into the front surface of the base substrate 101 in the peripheral area where the first channel CHC of the gate driving circuit 200 is formed.

The light passes through the first gate electrode GEC having the transparent conductive material and is irradiated into the semiconductor layer 131 of the first channel CHC, so that amorphous silicon a-Si of the semiconductor layer 131 is partially crystallized. Since the light L is irradiated into front surface of the base substrate 101, the poly-silicon layer is formed at the front channel portion proximal the first gate electrode GEC of the first channel CHC.

The light L passing through the base substrate 101 is reflected by the reflective plate 160 disposed under the base substrate 101 and then is irradiated into a rear surface of the base substrate 101, so that the back channel portion of the first channel CHC is crystallized. Therefore, the light is irradiated into the front and rear portions of the first channel CHC at the same time, so that the poly-silicon layer is entirely formed over the first channel CHC.

FIG. 7C is a cross-sectional view illustrating a direction of crystal growing of a channel of the display substrate of FIG. 7B.

Referring to FIGS. 6 and 7C, when the light L is irradiated into the first channel CHC, crystal grows from both ends of the channel in which the light is less irradiated. Accordingly, a direction of crystal growing is substantially the same as the direction of electron drifting, so that a channel having a high electron mobility is formed.

In the present exemplary embodiment, the light L is irradiated after forming the first gate electrode GEC, but it is not limited thereto. Alternatively, the light L may be irradiated in forming the semiconductor layer 131 having amorphous silicon, forming the ohmic contact layer 132 doped with impurities, etching the second metal layer to form the first source electrode SEC and the first drain electrode DEC, and forming the second insulating layer 140.

According to the present exemplary embodiment, the gate electrode having the transparent conductive material is formed over the source and drain electrodes as a top-gate structure, and the top exposing process and the back exposing process are performed at the same time. In the top exposing process, the light is irradiated into the front surface of the base substrate. In the back exposing process, the light is reflected by the reflective plate and is irradiated into the rear surface of the base substrate. Therefore, the front channel and the back channel are crystallized at the same time, and the direction of crystal growing is substantially the same as the direction of electron drifting, so that a channel having high electron mobility is formed.

In addition, since the light is not irradiated into the display area DA, the second channel CHP of the pixel transistor TRP includes amorphous silicon.

Figure 8:
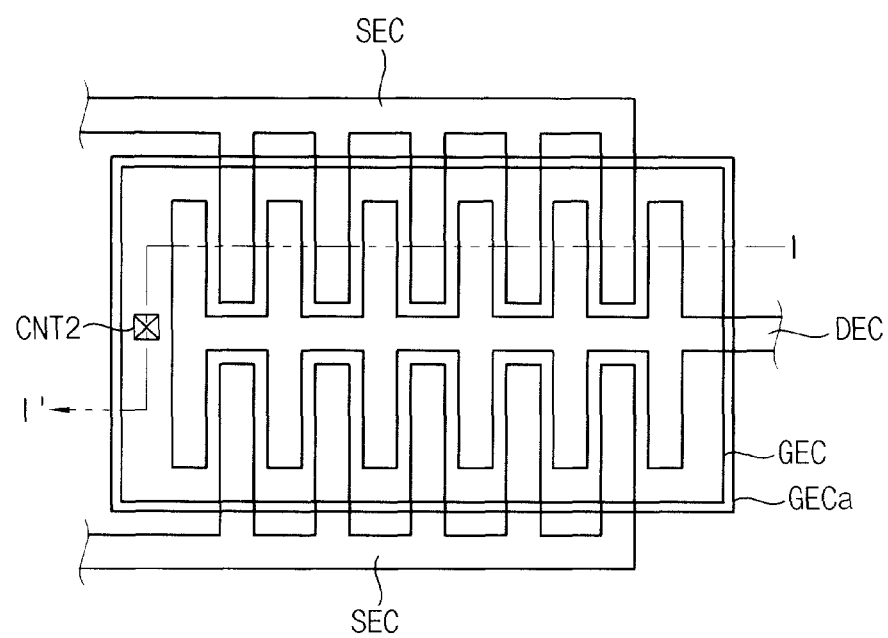
FIG. 8 is a plan view illustrating a circuit transistor according to an exemplary embodiment of the present invention.
Figure 9:
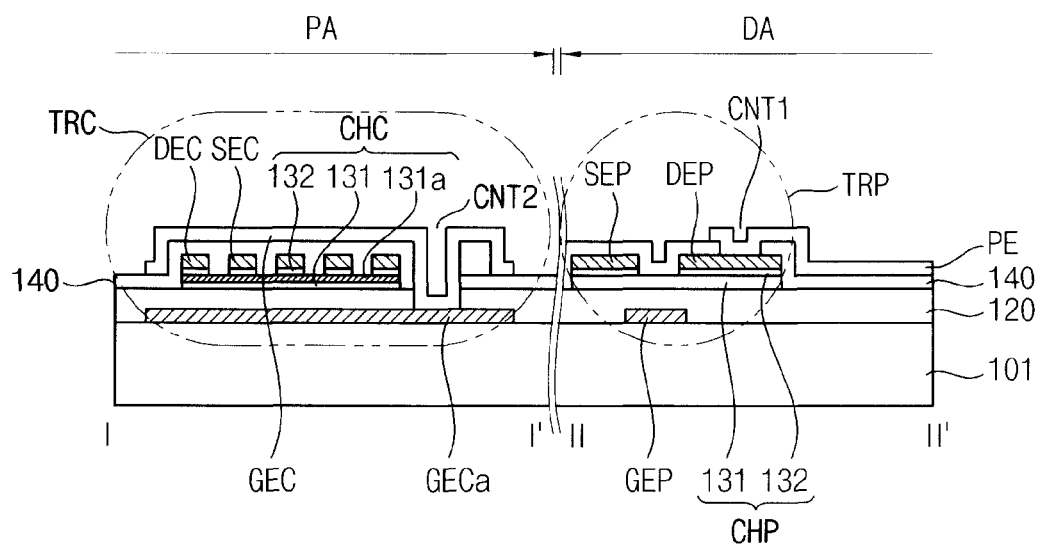
FIG. 9 is a cross-sectional view illustrating a display substrate according to an exemplary embodiment of the present invention.

FIG. 8 is a plan view illustrating a circuit transistor according to an exemplary embodiment of the present invention. FIG. 9 is a cross-sectional view illustrating a display substrate according to an exemplary embodiment of the present invention.

The display substrate according to the present exemplary embodiment is substantially the same as the display substrate according to the previous exemplary embodiment except for further forming a gate electrode on the base substrate 101. Accordingly, any further repetitive explanation will be omitted.

Referring to FIGS. 8 and 9, the circuit transistor TRC according to the present embodiment includes a third gate electrode GECa, a first source electrode SEC, a first drain electrode DEC, a first channel CHC, and a first gate electrode GEC formed on the base substrate 101. The circuit transistor TRC has a double-gate structure.

The third gate electrode GECa is formed on the base substrate 101. The first insulating layer 120 is formed on the third gate electrode GECa.

The first source electrode SEC and the first drain electrode DEC are formed on the first insulating layer 120 and correspond to the third gate electrode GECa.

The first source electrode SEC and the first drain electrode DEC are insulated from the third gate electrode GEC by the first insulating layer 120.

The first channel CHC is defined by a separated area between the first source electrode SEC and the first drain electrode DEC. The first channel CHC includes a poly-silicon layer. The poly-silicon layer of the first channel CHC is formed at the front channel portion 131*a* proximal to the first gate electrode GEC.

The second insulating layer 140 is formed over the first source electrode SEC and the first drain electrode DEC.

The first gate electrode GEC is formed on the second insulating layer 140 in the peripheral area PA, and has the transparent conductive material substantially the same as the pixel electrode PE in the pixel area DA. The first gate electrode GEC makes contact with the third gate electrode GECa formed on the base substrate 101 through a second contact hole CNT2.

The first source electrode SEC and the first drain electrode DEC are insulated from the first gate electrode GEC by the second insulating layer 140.

FIGS. 10A, 10B, 10C, 10D, 10E and 10F are cross-sectional views illustrating a method for forming the display substrate of FIG. 9.

The method for forming the display substrate according to the present exemplary embodiment is substantially the same as the method for forming the display substrate according to the previous exemplary embodiment in FIGS. 5A to 5F except for further including forming a gate electrode on the base substrate 101. Accordingly, any further repetitive explanation will be omitted.

Figure 10A:
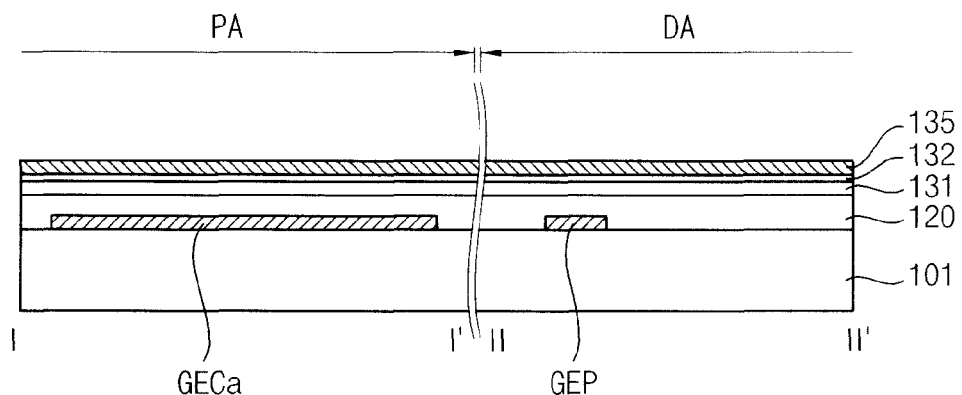
FIGS. 10A, 10B, 10C, 10D, 10E and 10F are cross-sectional views illustrating a method for forming the display substrate of FIG. 9.

Referring to FIGS. 9 and 10A, the first metal layer is formed on the base substrate 101. The first metal pattern is formed using the first photo pattern. The first metal pattern includes the third gate electrode GECa formed in the peripheral area, and the gate line GL and the second gate electrode GEP formed in the display area DA.

The first insulating layer 120 is formed on the first base substrate 101 on which the first metal pattern is formed. The semiconductor layer 131 having amorphous silicon, the ohmic contact layer 132 having impurities, and the second metal layer 135 are formed on the first insulating layer 120.

Figure 10B:
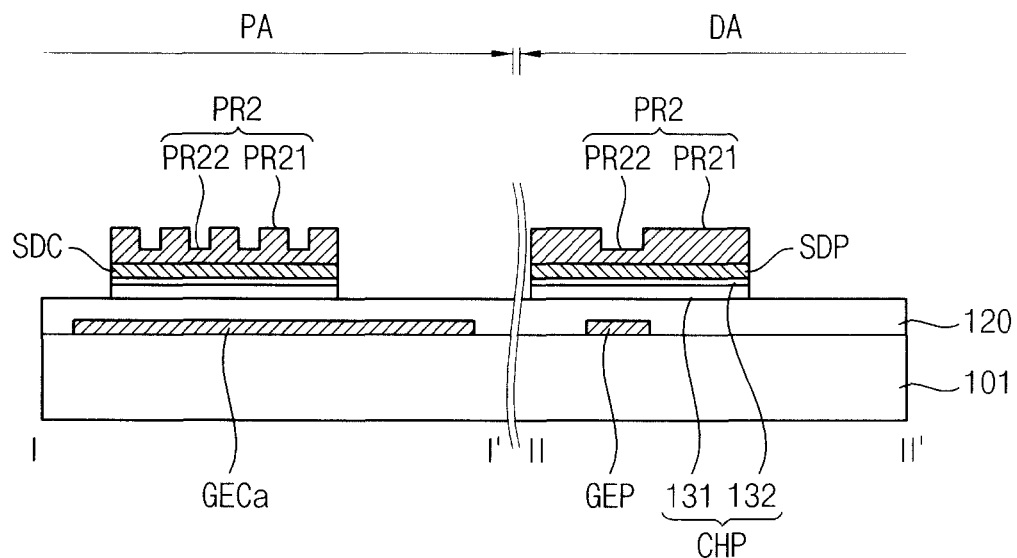

Referring to FIGS. 9 and 10B, the second photo pattern PR2 is formed on the first base substrate 101 on which the second metal layer 135 is formed. The pixel metal pattern SDP is formed in the display area DA, and the circuit metal pattern SDC is formed in the peripheral area PA using the second photo pattern PR2.

Figure 10C:
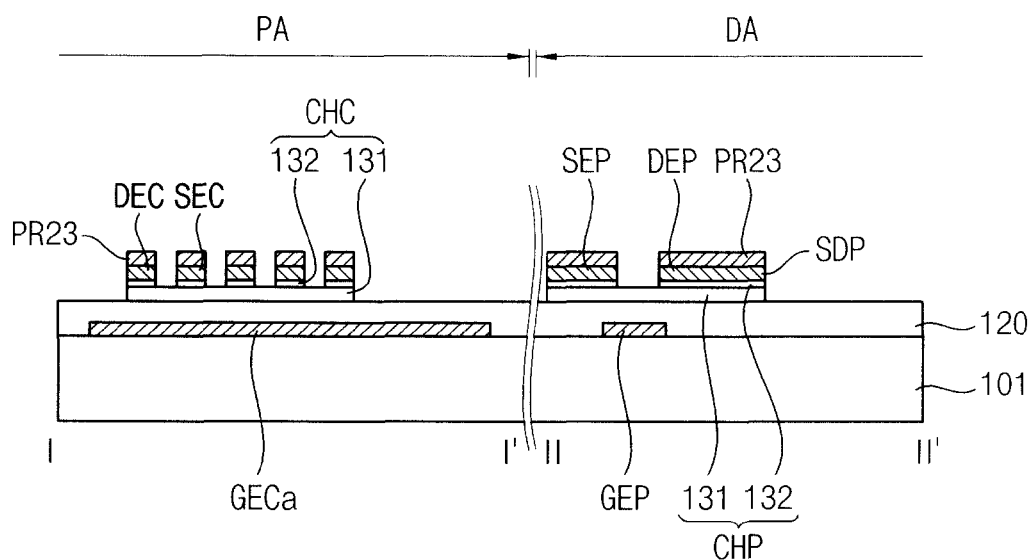

Referring to FIGS. 9 and 10C, the second photo pattern PR2 is partially removed to form the first source electrode SEC, the first drain electrode DEC, the second source electrode SEC, and the second drain electrode DEP using the third pattern PR23. In addition, the semiconductor layer 131 of the first channel CHC and the second channel CHP is exposed.

Figure 10D:
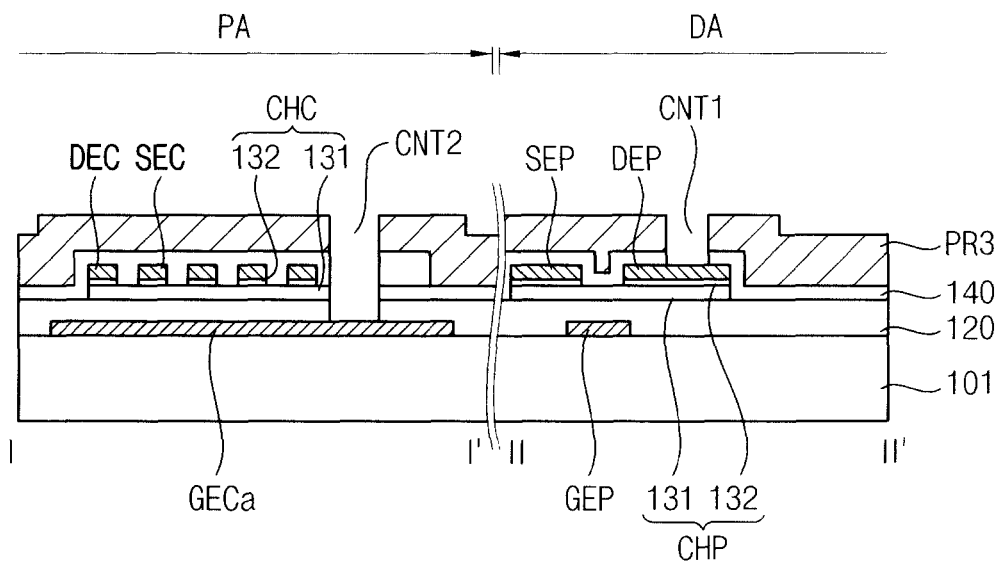

Referring to FIGS. 9 and 10D, the second insulating layer 140 is formed on the base substrate 101 on which the first channel CHC and the second channel CHP are formed. The second contact hole CNT2 is formed in the peripheral area, and a first contact hole CNT1 is formed in the display area DA using the third photo pattern PR3. The second contact hole CNT2 exposes the third gate electrode GECa, and the first contact hole CNT1 exposes the second drain electrode DEP.

Figure 10E:
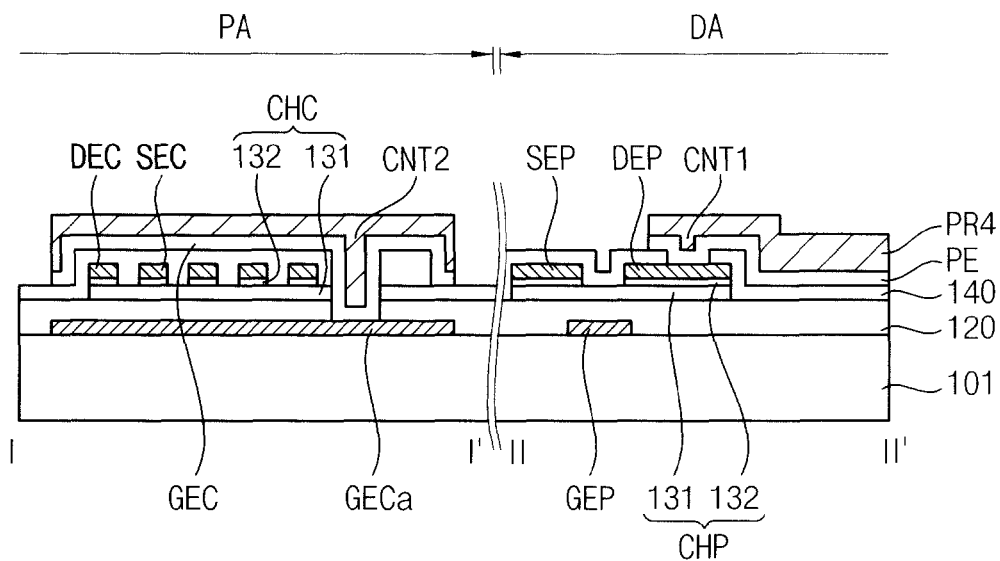

Referring to FIGS. 9 and 10E, the transparent conductive layer is formed on the base substrate 101 on which the first contact hole CNT1 and the second contact hole CNT2 are formed. The first gate electrode GEC is formed in the peripheral area PA corresponding to the third gate electrode GECa and the pixel electrode PE is formed in display area DA, using a fourth photo pattern PR4.

Figure 10F:
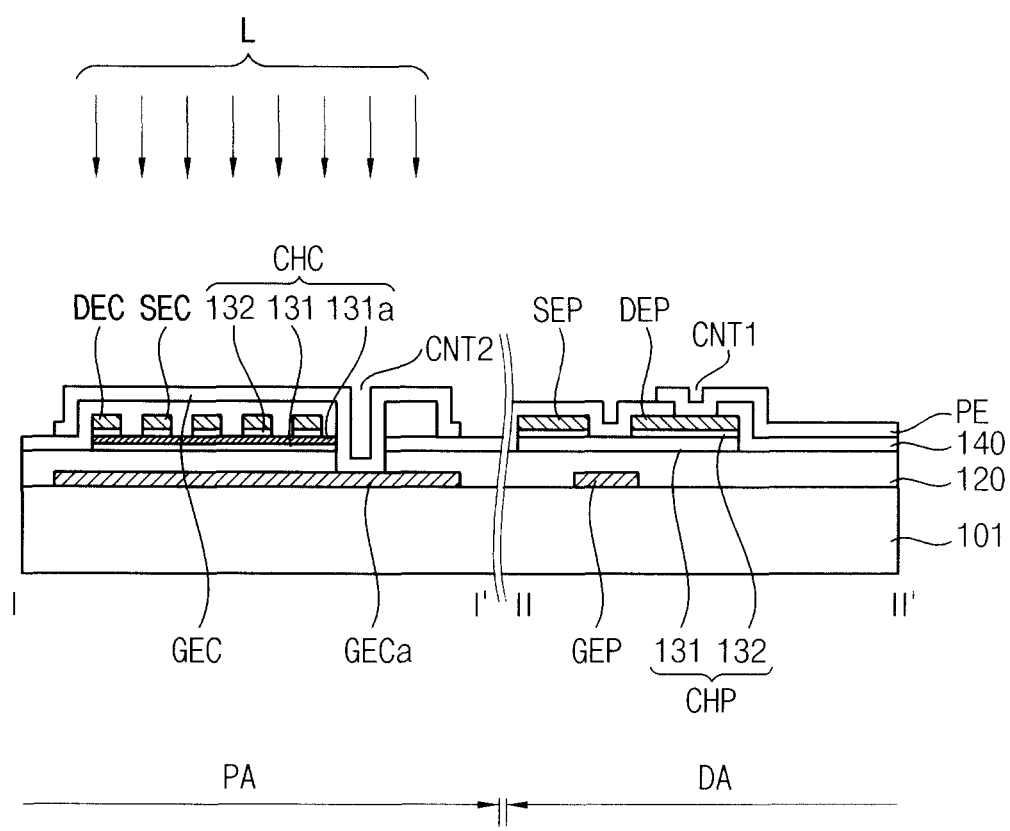

Referring to FIGS. 9 and 10F, the light L is irradiated into the front surface of the base substrate 101 in the peripheral area PA, where the first channel CHC of the gate driving circuit 200 is formed.

The light passes through the first gate electrode GEC having the transparent conductive material and is irradiated into the semiconductor layer 131 of the first channel CHC, so that amorphous silicon s-Si of the semiconductor layer 131 is partially crystallized.

When the light L is irradiated into the front surface of the base substrate 101, the poly-silicon layer 131*a* is formed at the front channel portion proximal to the first gate electrode GEC of the first channel CHC.

In the present exemplary embodiment, the light L is irradiated after forming the first gate electrode GEC, but it is not limited thereto. Alternatively, the light L may be irradiated in forming the semiconductor layer 131 having amorphous silicon, forming the ohmic contact layer 132 doped with impurities, etching the second metal layer to form the first source electrode SEC and the first drain electrode DEC, and forming the second insulating layer 140.

According to the present embodiment, the gate electrode having the transparent conductive material is formed over the source and drain electrodes in a top-gate structure, and the light is irradiated into the front surface of the base substrate in a top exposing process. Therefore, the poly-silicon layer is formed at the front channel portion of the channel through the gate electrode, so that characteristics of the poly-silicon transistor may be improved.

In addition, since the light is not irradiated into the display area DA, the second channel CHP of the pixel transistor TRP includes amorphous silicon.

The foregoing is illustrative of the present invention and is not to be construed as limiting thereof. Although practical exemplary embodiments of the present invention have been described, those skilled in the art will readily appreciate that many modifications are possible to the exemplary embodiments and that such modifications to the disclosed exemplary embodiments, as well as other exemplary embodiments, are intended to be included within the scope of the appended claims.

What is claimed is:

1. A display substrate comprising:
    a base substrate including a display area and a peripheral area surrounding the display area;
    a bottom-gate electrode formed on the base substrate in the peripheral area
    a first insulating layer formed on the base substrate and on the bottom-gate electrode;
    a pixel disposed in the display area, and including a pixel electrode having a transparent conductive material and fad led on the base substrate on which the first insulating layer is formed; and
    a circuit including a circuit transistor disposed in the peripheral area to drive the pixel and including a first channel and first source, drain and gate electrodes, the first channel being formed on the base substrate on which the first insulating layer is formed and having a poly-silicon layer, the first source and drain electrodes being formed on the first channel and being spaced apart from each other, the first gate electrode being a top-gate electrode formed over the first source and drain electrodes corresponding to the first channel and having the transparent conductive material, wherein the first source electrode has a convex and concave structure which has a repeated U-shape and the first drain electrode has a convex and concave structure which has a repeated U-shape corresponding to the first source electrode, and wherein the top-gate electrode is electrically connected to the bottom-gate electrode through a contact hole in the first insulating layer.

2. The display substrate of claim 1, wherein the transparent conductive material comprises indium tin oxide (ITO) or indium zinc oxide (IZO).

3. The display substrate of claim 1, wherein the pixel further comprises a pixel transistor connected to gate and data lines, and the pixel transistor is electrically connected to the pixel electrode.

4. The display substrate of claim 3, wherein the pixel transistor comprises;
a second gate electrode connected to the gate line and formed between the base substrate and the first insulating layer;
a second channel disposed on the first insulating layer and including an amorphous silicon layer; and
second source and drain electrodes formed on the second channel and spaced apart from each other.

5. The display substrate of claim 1, wherein the bottom-gate electrode comprises a metal.

6. The display substrate of claim 1, wherein the circuit is a gate driving circuit that applies a gate signal to the gate line.

7. The display substrate of claim 1, wherein the poly-silicon layer formed over a portion of the first channel is proximal to the first gate electrode.

8. The display substrate of claim 1, wherein the poly-silicon layer is formed over the entire first channel.

9. The display substrate of claim 8, wherein the base substrate comprises a transparent material.

10. The display substrate of claim 8, wherein the poly-silicon layer is formed of a crystal grown from both ends of the first channel toward a central portion of the first channel.

11. A method of manufacturing a display substrate, the method comprising:
forming a bottom-gate electrode on a base substrate in a peripheral area;
forming a semiconductor layer comprising a first insulating layer and an amorphous silicon layer on the base substrate having a display area and the peripheral area surrounding the display area;
forming a circuit metal pattern in the peripheral area and a pixel metal pattern in the pixel area using a photo pattern;
patterning the circuit metal pattern to form a first channel, and first source and drain electrodes;
forming a first gate electrode over the first source and drain electrodes, the first gate electrode being a top-gate electrode, and a pixel electrode over the pixel metal pattern, respectively, the first gate electrode and the pixel electrode including a transparent conductive material; and
exposing the first channel to form a poly-silicon layer,
wherein the first source electrode has a convex and concave structure which has a repeated U-shape and the first drain electrode has a convex and concave structure which has a repeated U-shape corresponding to the first source electrode, and
wherein the top-gate electrode is electrically connected to the bottom-gate electrode through a contact hole in the first insulating layer.

12. The method of claim 11, wherein the poly-silicon layer is formed by a front exposing process, such that light is irradiated toward an surface of the base substrate proximal to the first gate electrode in the front exposing process.

13. The method of claim 12, wherein the poly-silicon layer is formed in a portion of the first channel proximal to the first gate electrode.

14. The method of claim 12, wherein the poly-silicon layer is formed via the front exposing process and a back exposing process at the same time, such that the light irradiated toward the front surface of the base substrate is reflected by a reflective plate disposed under the base substrate and is irradiated toward a surface of the base substrate distal from the first gate electrode in the back exposing process.

15. The method of claim 14, wherein the base substrate comprises a transparent material.

16. The method of claim 14, wherein the poly-silicon layer is entirely formed over the first channel by the front exposing process and the back exposing process.

17. The method of claim 16, wherein a crystal grows from both ends of the first channel to a central portion to form the poly-silicon layer.

18. The method of claim 11, wherein the patterning the circuit metal pattern further comprises patterning the pixel metal pattern to form a second channel and second source and drain electrodes.

19. A display substrate comprising:
a base substrate having a display area and a peripheral area;
a bottom-gate electrode formed on the base substrate in the peripheral area
a gate driving circuit in the peripheral area comprising top-gate thin-film transistors having transparent top-gate electrodes formed over source electrodes, drain electrodes and channels; and
pixels in the display area comprising bottom-gate pixel thin-film transistors,
wherein a poly-silicon layer is formed at front channel portions of the channels proximal to respective transparent top-gate electrodes by light passing through the transparent top-gate electrodes and irradiating amorphous silicon semiconductor layers of the channels,
wherein the source electrode has a convex and concave structure which has a repeated U-shape and the drain electrode has a convex and concave structure which has a repeated U-shape corresponding to the source electrode, and
wherein the top-gate electrodes are electrically connected to the bottom-gate electrode through a contact hole in an insulating layer on the base substrate.

* * * * *